(12) United States Patent
Lin et al.

(10) Patent No.: US 9,196,623 B2
(45) Date of Patent: Nov. 24, 2015

(54) SEMICONDUCTOR CIRCUIT STRUCTURE AND PROCESS OF MAKING THE SAME

(75) Inventors: Shu-Cheng Lin, Taipei (TW); Zih-Song Wang, Hsinchu (TW); Yi-Shiang Chang, Changhua County (TW)

(73) Assignee: Powerchip Technology Corporation, Hsinchu Science Park, Hsinchu (TW)

( * ) Notice: Subject to any disclaimer, the term of this patent is extended or adjusted under 35 U.S.C. 154(b) by 494 days.

(21) Appl. No.: 13/603,426

(22) Filed: Sep. 5, 2012

(65) Prior Publication Data

US 2013/0264622 A1    Oct. 10, 2013

(30) Foreign Application Priority Data

Apr. 6, 2012    (TW) .............................. 101112247 A

(51) Int. Cl.
| | |
|---|---|
| H01L 21/426 | (2006.01) |
| H01L 21/311 | (2006.01) |
| H01L 21/308 | (2006.01) |
| H01L 21/3213 | (2006.01) |
| H01L 27/115 | (2006.01) |
| H01L 29/66 | (2006.01) |

(52) U.S. Cl.
CPC ........ *H01L 27/115* (2013.01); *H01L 29/66477* (2013.01)

(58) Field of Classification Search
None
See application file for complete search history.

(56) References Cited

U.S. PATENT DOCUMENTS

| 2008/0013377 A1* | 1/2008 | Sel et al. .................. 365/185.17 |
| 2008/0085581 A1* | 4/2008 | Kim et al. ...................... 438/241 |
| 2010/0301458 A1* | 12/2010 | Sewell et al. ................. 257/618 |

FOREIGN PATENT DOCUMENTS

| CN | 101154031 A | 4/2008 |
| CN | 101159226 A | 4/2008 |

* cited by examiner

*Primary Examiner* — Calvin Choi
*Assistant Examiner* — Xiaoming Liu
(74) *Attorney, Agent, or Firm* — Winston Hsu; Scott Margo

(57) ABSTRACT

A semiconductor circuit structure and process of making the same is provided in the present invention, comprising the steps of providing a substrate having a target layer and a hard mask layer, forming a patterned small core body group and a large core body group on the hard mask layer, forming a spacer material layer conformally on the substrate and the core body groups, forming filling bodies in each recess of the spacer material layer, performing a first etching process to remove exposed spacer material layer, using the filling bodies as a mask to perform a second etching process for patterning the hard mask layer, and using the patterned hard mask layer as a mask to perform a third etching process for patterning the conductive layer.

10 Claims, 11 Drawing Sheets

__US 9,196,623 B2__

1

SEMICONDUCTOR CIRCUIT STRUCTURE AND PROCESS OF MAKING THE SAME

BACKGROUND OF THE INVENTION

1. Field of the Invention

The present invention relates generally to a semiconductor structure and a process of making the same, and more particularly, to a NAND flash circuit structure and a process of making the same.

2. Description of the Prior Art

The principle of a photolithographic process is to transfer a circuit pattern on a mask to a wafer by a method of exposure and development, thereby producing specific circuit patterns on the wafer. However, with the trend towards scaling down the semiconductor products, the conventional photolithographic technologies face formidable challenges. Takes mainstream ArF excimer laser method with wavelength of 193 nm for example, the reachable minimum half-pitch of a transistor device produced by this kind of light source during exposure in the photolithographic process is 65 nm. By incorporating the well-known immersion lithography technology, the reachable half-pitch may be further reduced to 45 nm, which is almost the physical limitation in the photolithographic processes. For this reason, if the half-pitch of the semiconductor device need to go under 45 nm, the industry needs to utilize more advanced a photo-lithographic technology, such as a double patterning technology, an extreme ultra violet (EUV) technology, a maskless photolithography (ML2) technology or a nano-imprint technology, etc.

Double patterning is one of most mature method in the aforementioned various advanced photolithography technologies. The double patterning technology enables the use of current available photolithographic tool to produce desired finer circuit patterns, without the requirement of purchasing extremely expensive advanced photolithography tools thereby avoiding huge investments. As the double patterning technology and relevant equipments gradually mature in the industry, the 193 nm immersion lithography technology once limited by the physical limits can be further applied to the advanced process nodes of 32 nm, or even 22 nm, thereby becoming the mainstream photolithographic technology for the next semiconductor generation.

The principle of the double patterning technology is to separate one fine semiconductor circuit pattern into two alternative or complementary circuit patterns. The two separate patterns will be transferred respectively by the photolithographic process and then be combined on the wafer to obtain the final completed circuit pattern. Among various double patterning technologies, negative self-aligned double patterning (N-SADP) is one of mature process already applied in the current NAND flash process flow. The N-SADP process can produce word lines or bit lines with intervals smaller than 28 nm, thereby significantly improving the memory capacity in memory blocks.

The normal N-SADP process is able to produce fine word lines with identical intervals. However, due to the process nature, the number of word lines in a single memory block produced through this process is definitely an odd number. This characteristic can not fulfill the current memory standard of an even number of word lines in one memory block.

Accordingly, it is necessary for the semiconductor industry to improve the current double patterning technology in order to overcome the aforementioned problem.

SUMMARY OF THE INVENTION

To overcome the above-mentioned drawbacks in prior art, a novel semiconductor structure and a process of making the same are provided in the present invention. The process of the present invention is an improved negative self-aligned double patterning (N-SADP) process for semiconductor technology which can form a plurality of equally-spaced small circuit features and large circuit features at opposite sides of the small circuit features in one single unit area.

The object of the present invention is to provide a semiconductor process for forming special pattern features, comprising the steps of providing a substrate having a target layer and a hard mask layer, forming patterned small core body group and large core body group on the hard mask layer, forming a spacer material layer conformally on the substrate and the core body groups, forming filling bodies in each recess of the spacer material layer, performing a first etching process to remove the exposed spacer material layer, using the filling bodies as a mask to perform a second etching process for patterning the hard mask layer, and using the patterned hard mask layer as a mask to perform a third etching process for patterning the conductive layer.

Another object of the present invention is to provide a semiconductor circuit structure comprising a substrate, two select gates disposed on said substrate and an even number of spaced-apart word lines, wherein the select gates are provided with a first portion and a second portion, and the thicknesses of first portion and of the second portion are different.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles.

In the drawings.

Figure 1:
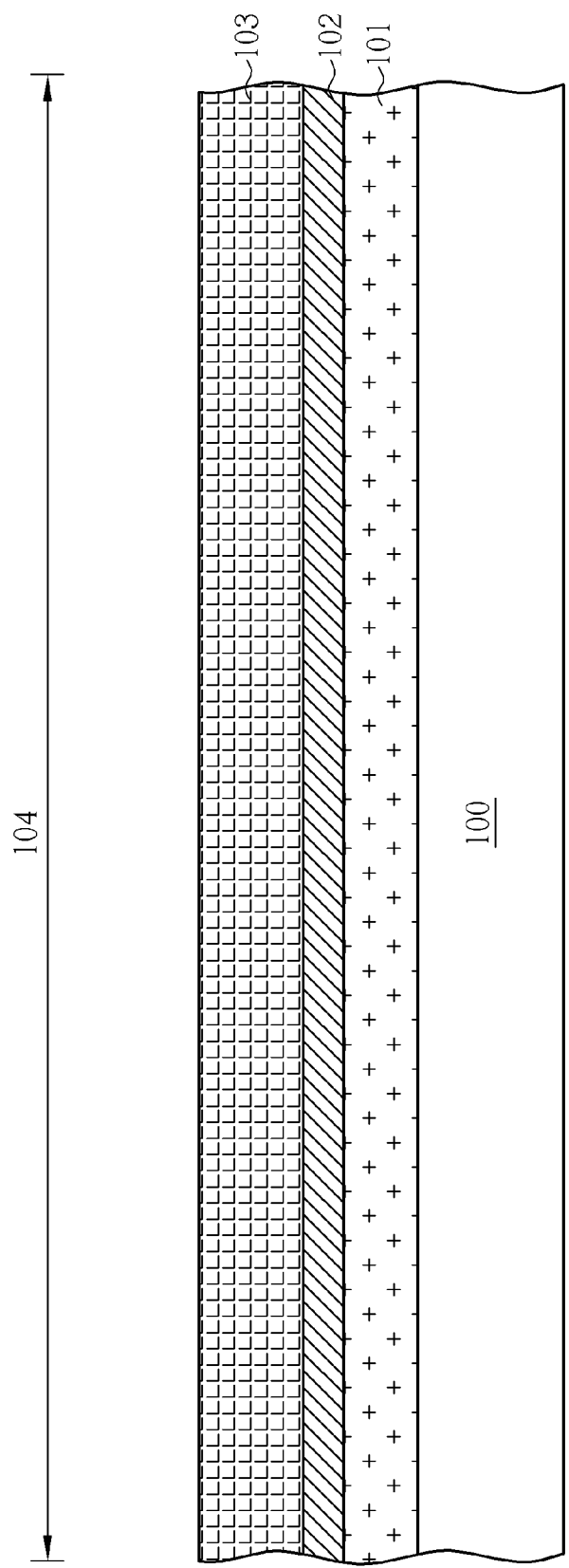
FIGS. 1-10 are cross-sectional views illustrating a semiconductor process in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the exemplary embodiment, reference is made to the accompanying drawings, which form a part thereof, and in which are illustrated by way of illustration of specific embodiments in which the invention may be practiced. These embodiments are described in sufficient details to allow those skilled in the art to practice the invention. It is to be understood that other embodiments may be utilized and structural, logical, or electrical changes may be made without departing from the scope of the present invention. The following detailed description is, therefore, not to be taken in a limiting sense, and the scope of the present inventions is defined only by the appended claims. Furthermore, certain terms are used throughout the following descriptions and claims to refer to specific components. As one skilled in the art will appreciate, consumer electronic equipment manufacturers may refer to a component by different names, for example, dielectric layer and insulating layer. This document does not intend to distinguish between components that differ in name but not function.

The exemplary embodiments will now be explained with reference to the accompanying drawings to provide a better understanding of the process of the present invention, wherein FIGS. 1-10 are cross-sectional views illustrating a semiconductor process in accordance with the preferred embodiment of the present invention. The method of the present invention is an improved approach to the conventional negative self-aligned double patterning (N-SADP) process, wherein the disclosed detailed steps can solve the problem that common N-SADP process can't produce an even number of equally-spaced word lines in one memory block.

Please refer to FIG. 1, a substrate is first provided to serve as a base for forming semiconductor devices in the structure of the preferred embodiment. A target layer, for example a conductive layer 101, and a hard mask layer 102 are sequentially formed on the substrate 100. The target layer is designed to be patterned into the components and conductive circuits of various desired semiconductor devices. In the preferred embodiment, the conductive layer 101 will be used in later processes to form conductive circuits, such as word lines, bit lines or select gates, etc. The hard mask layer 102 will also be patterned in later processes to serve as the etching mask for forming the conductive pattern features from the underlying conductive layer. In the embodiment, the substrate 100 may include a silicon substrate, a silicon-containing substrate, a GaN-on-silicon (or other material of Group III-V), a grapheme-on-silicon substrate or a silicon-on-insulator (SOI) substrate and so on, but not limited to a semiconductor substrate. The concept of the present invention may also be applied to other technical fields, such as the field of display panel. For example, the substrate 100 may be an insulating glass substrate or a quartz substrate. The material of the conductive layer 101 may include polycrystalline silicon, amorphous silicon, salicide or metal material, while the material of the target layer is, but not limited to, a conductive material, a semiconductor material or an insulating material. The material of the hard mask layer 102 may include silicon nitride, silicon oxide, but not limited to insulating materials. For example, the hard mask layer 102 may include a metal material such as titanium nitride (TiN).

In the following steps, refer again to FIG. 1, a material layer 103 is formed on the hard mask layer 102. The material layer 103 is designed to define core bodies for forming the core circuit pattern. For this purpose, the material layer 103 will be transformed into a plurality of protruding core bodies on the hard mask layer 102 in the later process to constitute the desired core circuit pattern. The detailed description will be explained in the embodiment hereafter. In this embodiment, the material layer 103 may include silicon nitride, silicon oxide or polycrystalline silicon, but is not limited thereto. However, the material layer 103 and the hard mask layer 102 must have different etching selectivity. That is, the material layer 103 and the hard mask layer 102 will have different etching rate in the same etching process.

Figure 2:
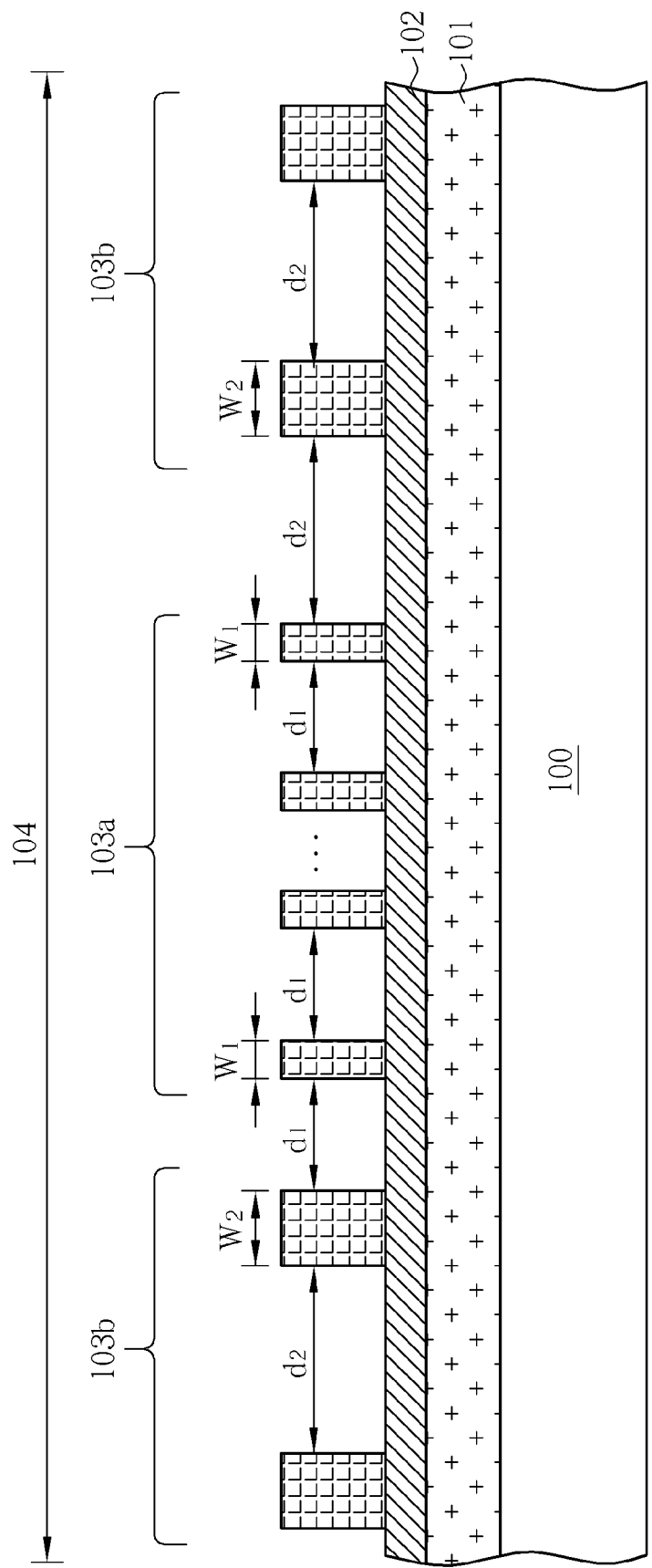

After forming the material layer 103, please refer to FIG. 2, a photolithographic/etching process is then performed to pattern the material layer 103. In the preferred embodiment, the material layer 103 is patterned into a plurality of core bodies with different sizes through the photolithographic/etching process, like the group of small core bodies 103a and the group of large core bodies 103b shown in FIG. 2. When observed from the top, the core bodies 103a/103b are arranged in spaced-apart line structure and define a common area referred herein as a feature unit 104. The surface of the entire substrate 100 may include a plurality of feature units 104 arranged in an array. Each feature unit 104 may be considered as a memory block in a common memory structure. The number of small core bodies 103a is half of the even number of the necessary word lines. For example, if a number M of word lines is required in the memory structure, the number of small core bodies is designed to be M/2. To explicitly describe the steps of present invention, the following drawings and embodiment will take the configuration of three small core bodies 103a as an example. The aforementioned photolithographic/etching process is a well-known method in the relevant field of technology, thus the redundant description is herein omitted.

With regard to the core bodies 103a/103b, please refer again to FIG. 2, the widths of the small core bodies 103a and large core bodies 103b are respectively $W_1$ and $W_2$. The width $W_2$ of the large core bodies 103b may be several-fold, for example, twice or three times the width $W_1$ of the small core bodies 103a. The width $W_2$ of large core bodies 103b must be able to provide a sufficient overlay budget for the following photolithographic process in order to form the desired circuit structure, such as a select gate. Furthermore, the small core bodies 103a are equally-spaced from each other by a first interval $d_1$, and the large core bodies 103b are equally-spaced from each other by a second interval $d_2$. Besides, one side of the group of the small core bodies 103a is spaced apart from the adjacent large core body 103b by the first interval $d_1$, while the other side of the group of the small core bodies 103a is spaced apart from the adjacent large core body 103b by the second interval $d_2$. In the preferred embodiment, the first interval $d_1$ is designed to be smaller than the second interval $d_2$. For example, the first interval $d_1$ may be 3F (ex. 84 nm), which is three times the size of the interval F (ex. 28 nm) between the desired final circuit structure (ex. word lines). The second interval $d_2$ may be 5F (ex. 140 nm), which is five times the size of the interval F. In the embodiment, the design of a relatively smaller first interval $d_1$ and a larger second interval $d_2$ may achieve the purpose of forming a mask structure with different widths at the opposite sides of the group of the small core bodies 103a in the later N-SADP process, thereby producing the desired circuit structure, such as the equally-spaced word lines and the select gate structure at the opposite sides of the word line. The aforementioned configuration is one of the essential features of the present invention. Detailed description will be explained in following embodiment.

Figure 3:
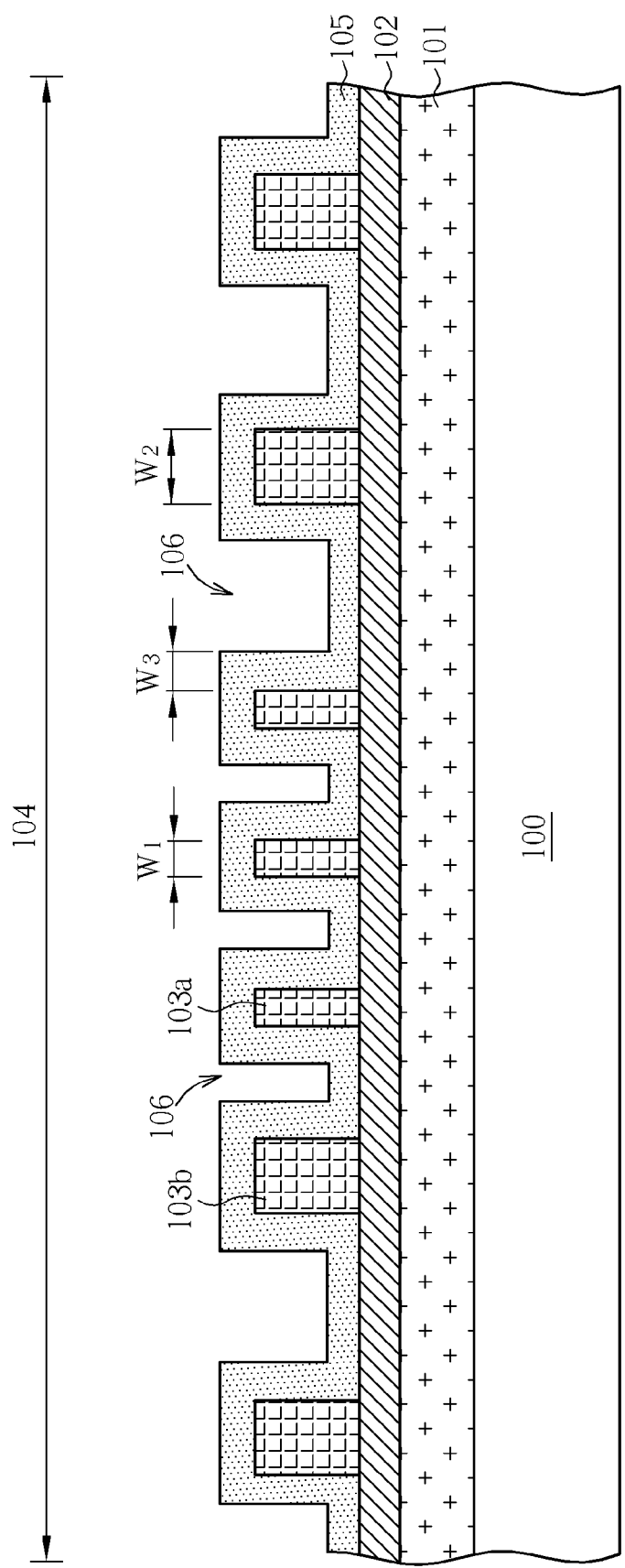

After the sizes of small core bodies 103a and of the large core bodies 103b are defined, please refer to FIG. 3, a deposition process is performed to form a spacer material layer 105 on the substrate 100. The spacer material layer 105 is formed conformally on the surface of the hard mask layer 102 and core bodies 103a/103b, with the same thickness throughout the substrate 100. In this manner, a plurality of recesses 106 are formed between the core bodies 103a/103b. The recesses are spaced-apart on the substrate in a fashion similar as the core body 103a/103b. In this embodiment, the material of the spacer material layer 105 may be, but not limited to, silicon nitride, silicon oxide or polycrystalline silicon, etc. However, the spacer material layer 105, the material layer 103 and the hard mask layer 102 must have different etching selectivities. That is, the spacer material layer 105, the material layer 103 and the hard mask layer 102 will have different etching rates under the same etching process. This may facilitate the removing of predetermined portion of the material layer 103 through the following anisotropic etching process with specific etching selectivity.

In the concept of present invention, the function of the spacer material layer 105 is to reduce the intervals between the core bodies 103a/103b. With regard to the N-SADP process, the thickness $W_3$ of the spacer material layer 105 is designed to be the interval between the desired final circuit structures, such as a plurality of equally-spaced word lines. In one preferred embodiment, the thickness of the deposited spacer material layer 105 is designed to be half the exposure limit value of the photolithographic tool used in the process. For example, in the condition that ArF excimer laser stepper (with an exposure wavelength of 193 nm) is utilized as the photolithographic tool, the exposure limit value will be 56 nm, so the thickness of spacer material layer 105 must be designed to be the value of 28 nm. Alternatively, the thickness $W_3$ of spacer material layer 105 may be designed to be one-third of the first interval $d_1$ between the small core bodies 103a or to be one-fifth of the second interval $d_2$ between the large core bodies 103b. The configuration of the predetermined and designed thickness for the deposited spacer material layer 105 may facilitate the formation of equally-spaced and equi-width word lines in later processes. Detailed description will be explained in following embodiment.

Figure 4:
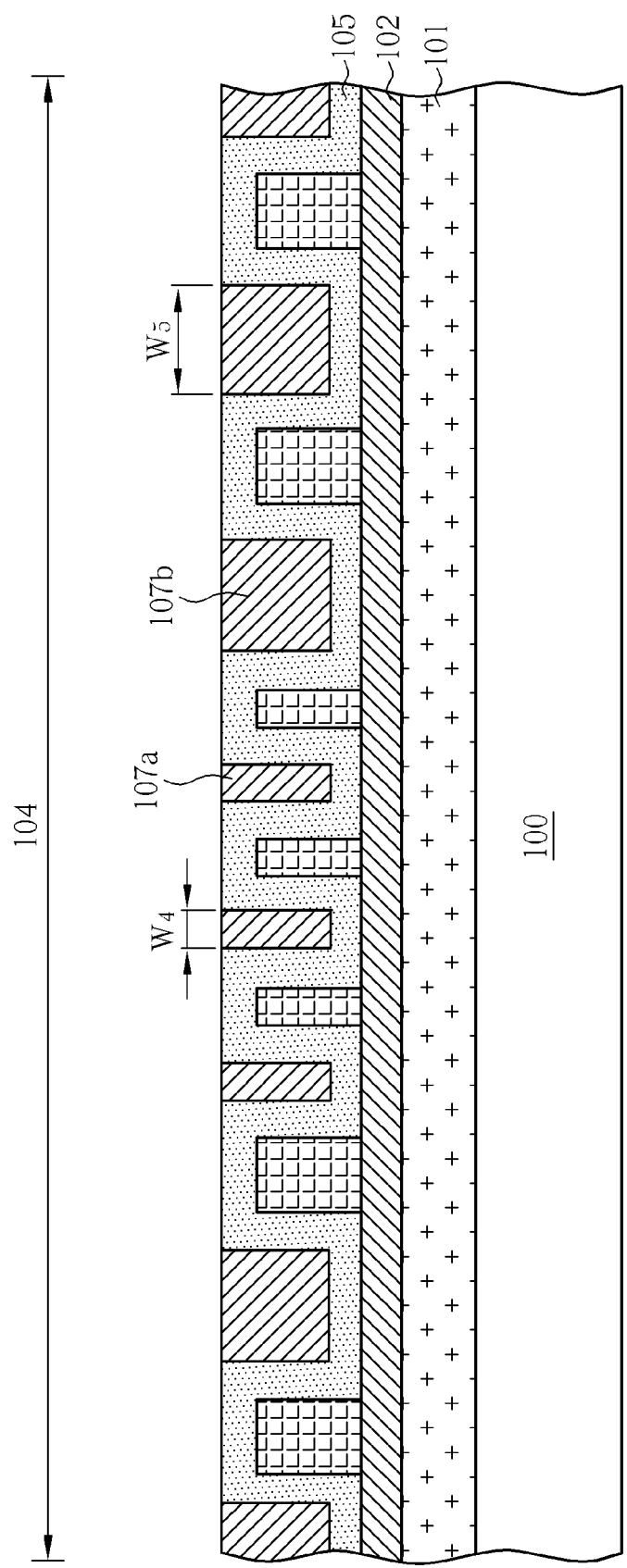

After the spacer material layer 105 is formed, please refer to FIG. 4, the recesses 106 are then filled up with a filling material, thereby forming a plurality of small filling bodies 107a and large filling bodies 107b with different widths. In the present invention, the function of the filling bodies 107a/107b is to serve as parts of the etching mask for the following processes, in order to obtain the desired circuit pattern. The material of the filling bodies 107a/107b may be silicon nitride, silicon oxide or polycrystalline silicon. However, the filling bodies 107a/107b, the surrounding spacer material layer 105, the material layer 103 and the hard mask layer 102 must have different etching selectivity, so that the filling bodies 107a/107b can be kept when undergoing the following etching process for removing the spacer material layer 105.

In one preferred embodiment of the present invention, the width $W_4$ (ex. 28 nm) of the small filling body 107a is designed to be the same as the width of desired final circuit structure (ex. word lines). The width $W_5$ of large filling body 107b is three times the width $W_4$ of the small filling body 107a, 84 nm for example. Optionally, depending on the process requirement, a chemical mechanical polishing process or an etching back process may be performed to planarize the surface of the deposited filling material, thereby obtaining the structure as shown in FIG. 4.

Figure 5:
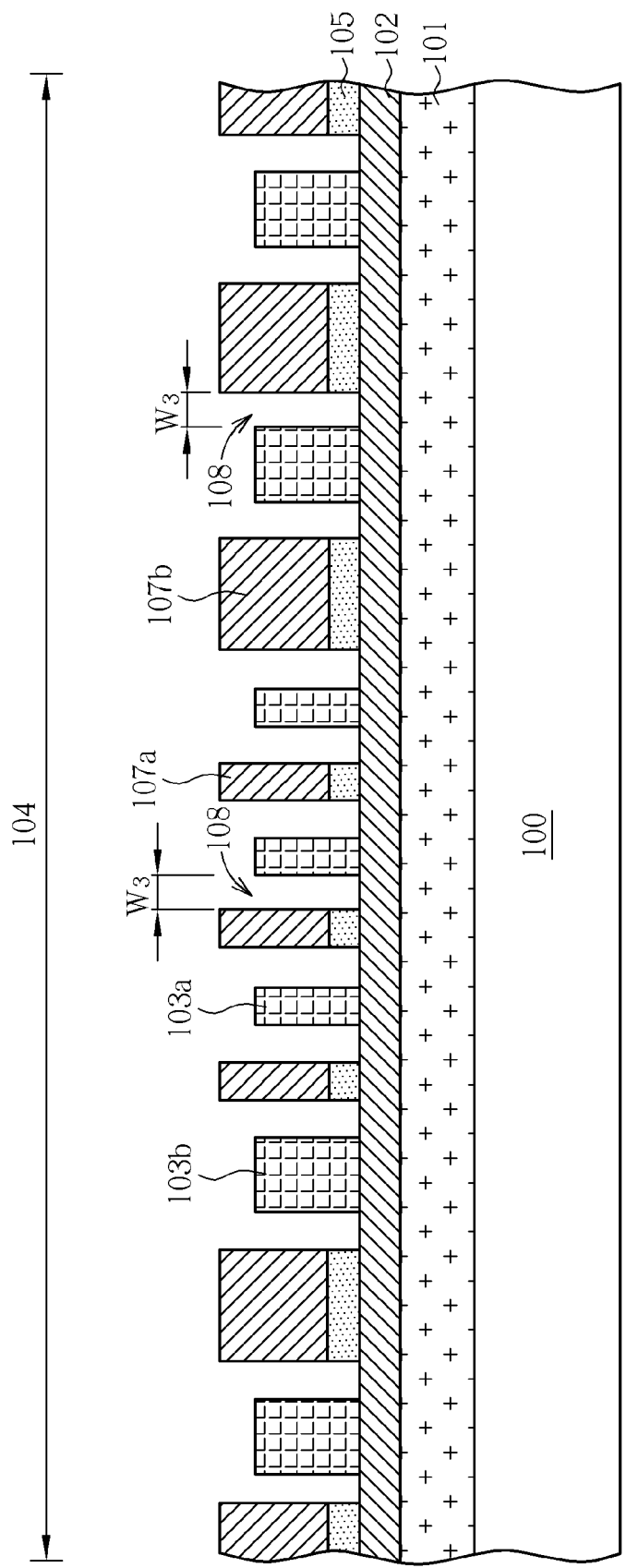

Please now refer to FIG. 5. An anisotropic (first) etching process is performed after the forming of the filling bodies 107a/107b. The first etching process has a different etching selectivity to the spacer material layer 105, the filling bodies 107a/107b and the material layer 103 so that the exposed spacer material layer 105 is etched away and the core bodies 103a/103b and filling bodies 107a/107b remain on the surface. The aforementioned remained core bodies 103a/103b and filling bodies 107a/107b may serve as a mask in following etching processes to obtain desired pattern. After the first etching process, a plurality of recesses 108 are formed between the core bodies 103a/103b and the filling bodies 107a/107b on the surface of the substrate 100 and expose the underlying hard mask layer 102. Since the recess 108 in the embodiment is formed by etching away the spacer material layer 105, the width of the recess 108 is the same as the thickness $W_3$ of the originally-deposited spacer material layer 105, and each recess 108 has the same width.

Figure 6:
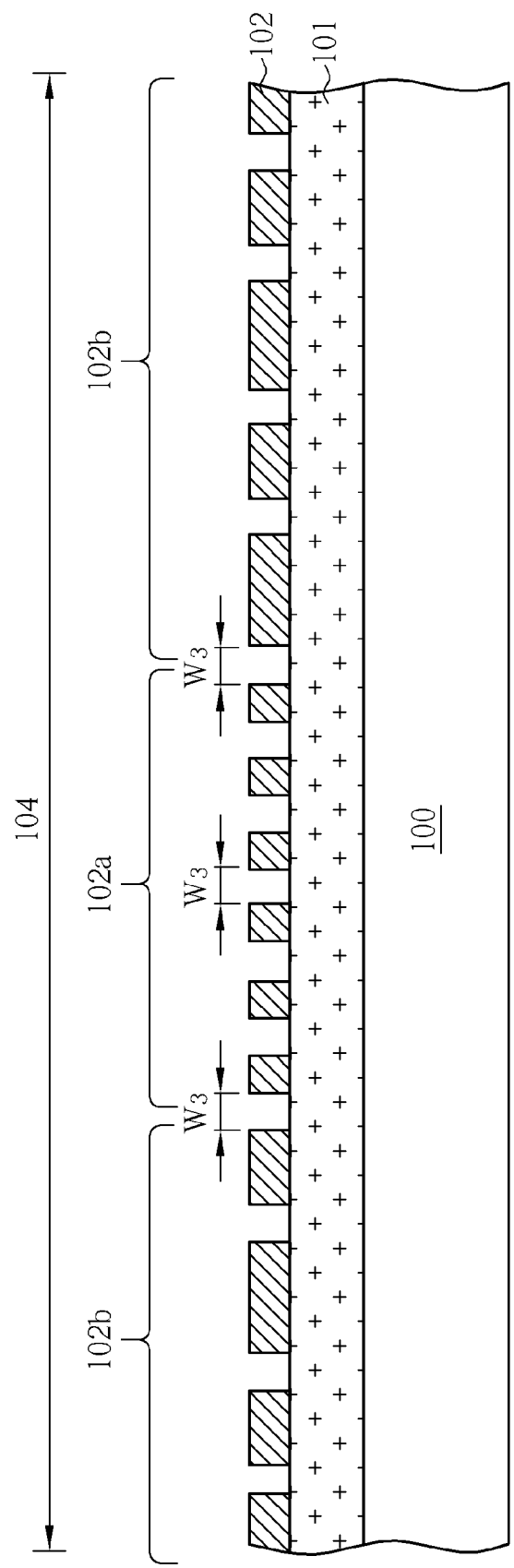

After the spacer material layer 105 is removed by the first etching process, please refer again to FIG. 5, the remained core bodies 103a/103b and filling bodies 107a/107 are used as a mask to perform a second etching process. The hard mask layer 102 exposed from the recesses 108 will be etched away by the second etching process, so that the feature pattern of the core bodies 103a/103b and the filling bodies 107a/107b once presented on the substrate is transferred to the hard mask layer 102. The core bodies 103a/103b and filling bodies 107a/107b will be removed after the aforementioned etching process to obtain the structure as shown in FIG. 6. The patterned hard mask layer 102 is provided with a plurality of mask bodies with different sizes, as the group of small hard mask bodies 102a and the group of large hard mask bodies 102b shown in FIG. 6. The hard mask bodies 102a/102b formed by the process of the present invention will have the same interval (ex. $W_3$), and the number of the small hard mask bodies 102a must be even and is twice the number of the small core bodies 103a defined in previous processes. For example, the number of the small hard mask bodies 102a is preferably $2^n$, wherein n is a positive integer.

Figure 7:
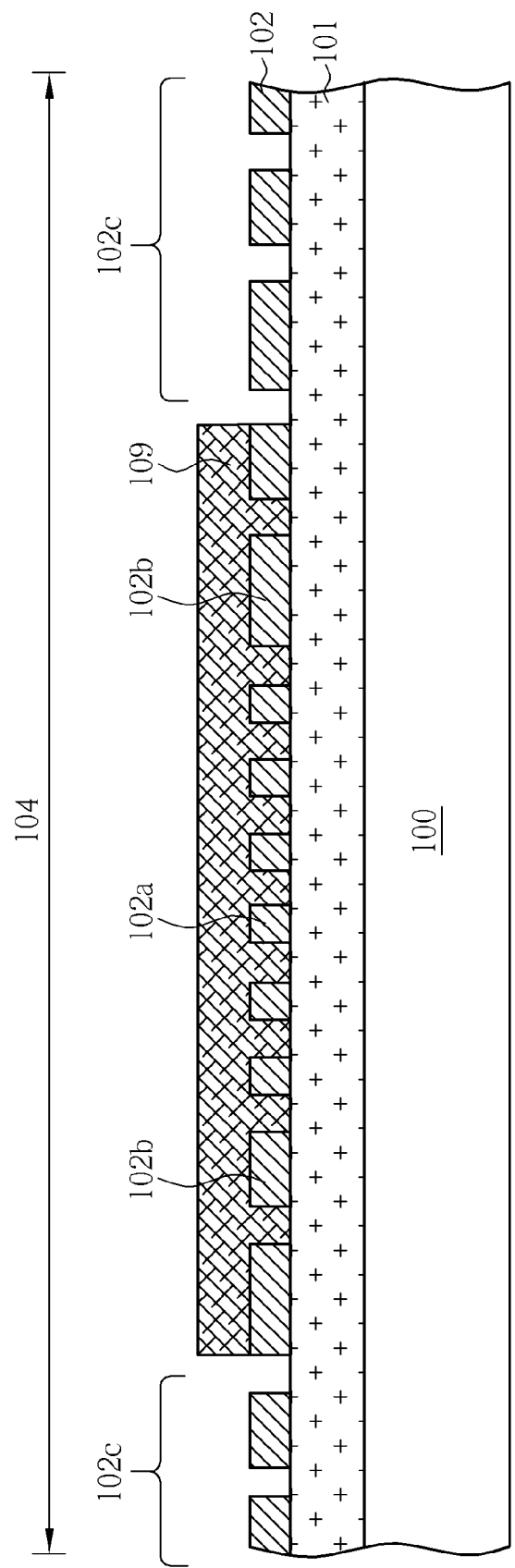
Figure 8:
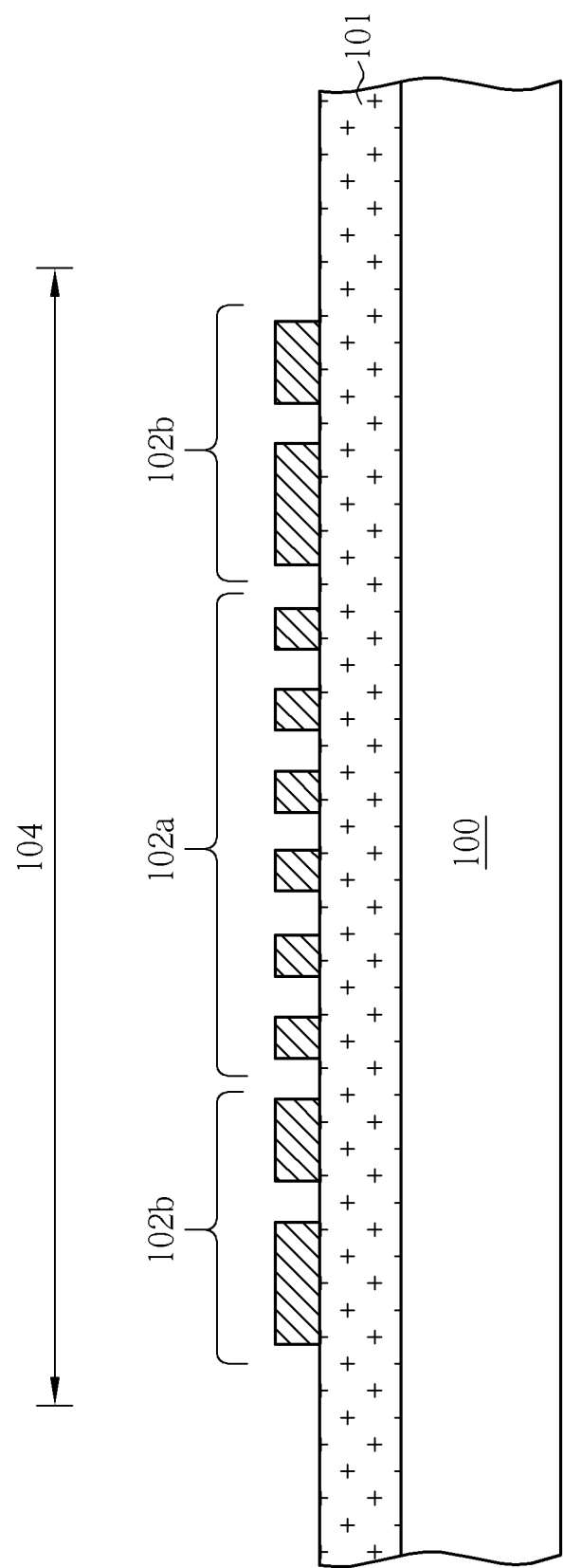

In following process, please refer to FIG. 7, the group of small hard mask bodies 102a and the adjacent group of several hard mask bodies 102b at two opposite sides of the group of the small hard mask bodies 102a are covered with a photoresist 109. In this embodiment, the purpose of covering the photoresist 109 is to keep the necessary pattern feature, such as word lines, bit lines or select gates, in a single feature unit 104. The photoresist 109 may be used as a mask to perform an etching process for removing the unnecessary pattern features outside the circuit pattern, such as the group of large hard mask bodies 102c shown in FIG. 7. Finally, as shown in FIG. 8, the photoresist 109 is removed to keep only the group of small hard mask bodies 102a and the group of large hard mask bodies 102b adjacent to the small hard mask bodies 102a on the substrate. Please note that the photoresist 109 shown in FIG. 7 only covers the two large hard mask bodies 102b at the opposite sides of the small hard mask bodies 102a. However, in other embodiments, the photoresist 109 may cover a wider area, for example, more than two large hard mask bodies 102b adjacent to the two opposite sides of the small hard mask bodies 102a, depending on the size of the circuit pattern (ex. a select gate) defined at the opposite sides of the small hard mask bodies 102a. The present invention takes two adjacent large hard mask bodies 102b as an exemplary embodiment.

Figure 9:
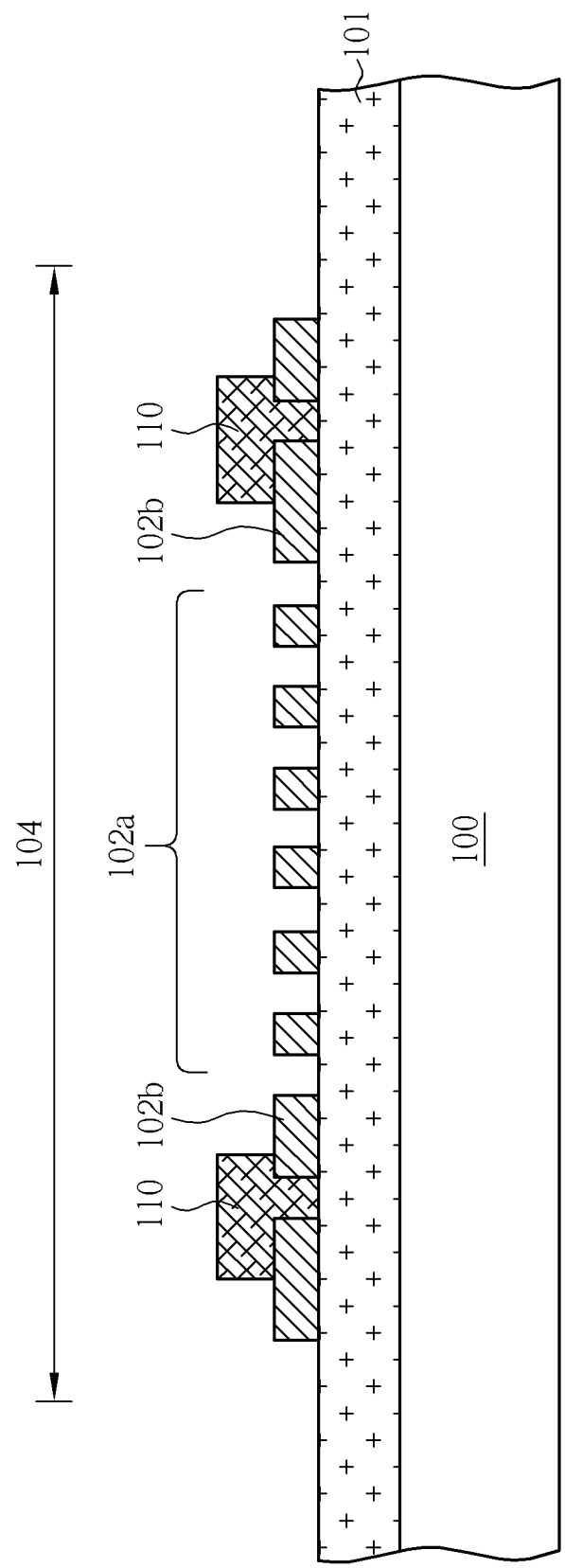

After removing the unnecessary pattern features in the hard mask layer 102, as shown in FIG. 9, a photoresist 110 is covered on the remained large hard mask bodies 102b. The purpose of covering photoresist 110 is to mask the gap between two adjacent large mask bodies 102b. In this manner, the adjacent large mask bodies 102b may be considered as a single hard mask body to produce desired circuit structure (ex. a select gate) in following processes. In the embodiment, as aforementioned, since the width $W_2$ of the formed large hard mask bodies 102b (especially the one nearest to the small hard mask bodies 102a) is several times the width $W_1$ of the small hard mask bodies 102a, the photoresist 110 will be provided with a sufficient overlay budget for covering the two large hard mask bodies 102b in the photolithographic process without alignment shift to the area beyond the two hard mask bodies 102b and without impacting the circuit pattern formed in the following processes.

Figure 10:
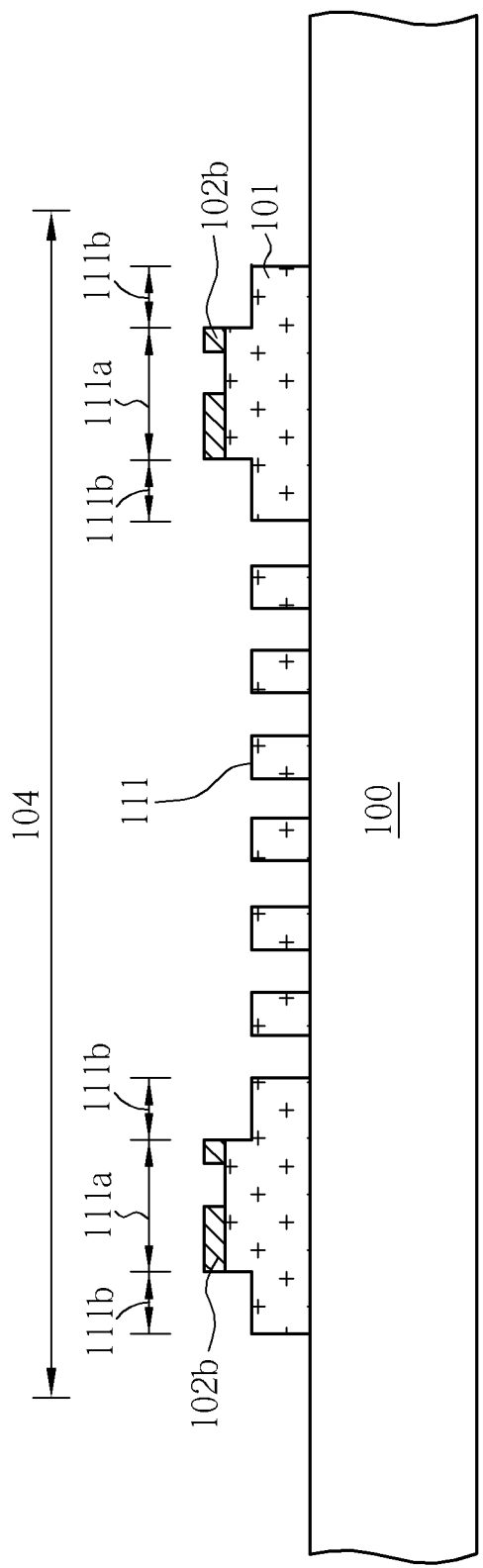

Finally, please refer to FIG. 10, the small hard mask bodies 102a, the large hard mask bodies 102b and the photoresist 110 are used as a mask to etch the conductive layer 101 after covering the photoresist 110. In this manner, an even number of spaced-apart word lines 111 and select gates at two opposite sides may be obtained in a memory block (i.e. feature unit 104). Since the hard mask bodies 102a/102b are gradually removed during the etching process, the portion of the select gate 112 (ex. the middle portion) defined by the hard mask area covered by the photoresist 110 is thicker, which is referred herein as the first portion 112a, while the portion of the select gate 112 (ex. the outer portion) defined by the hard mask area not covered by the photoresist 110 is thinner, which is referred herein as the second portion 112b. Therefore, the select gate 112 is in a reverse-T shape with a thicker middle portion and thinner outer portion. Furthermore, parts of the large hard mask bodies 102b covered by the photoresist 110 remain on the surface of the select gate 112.

Figure 11:
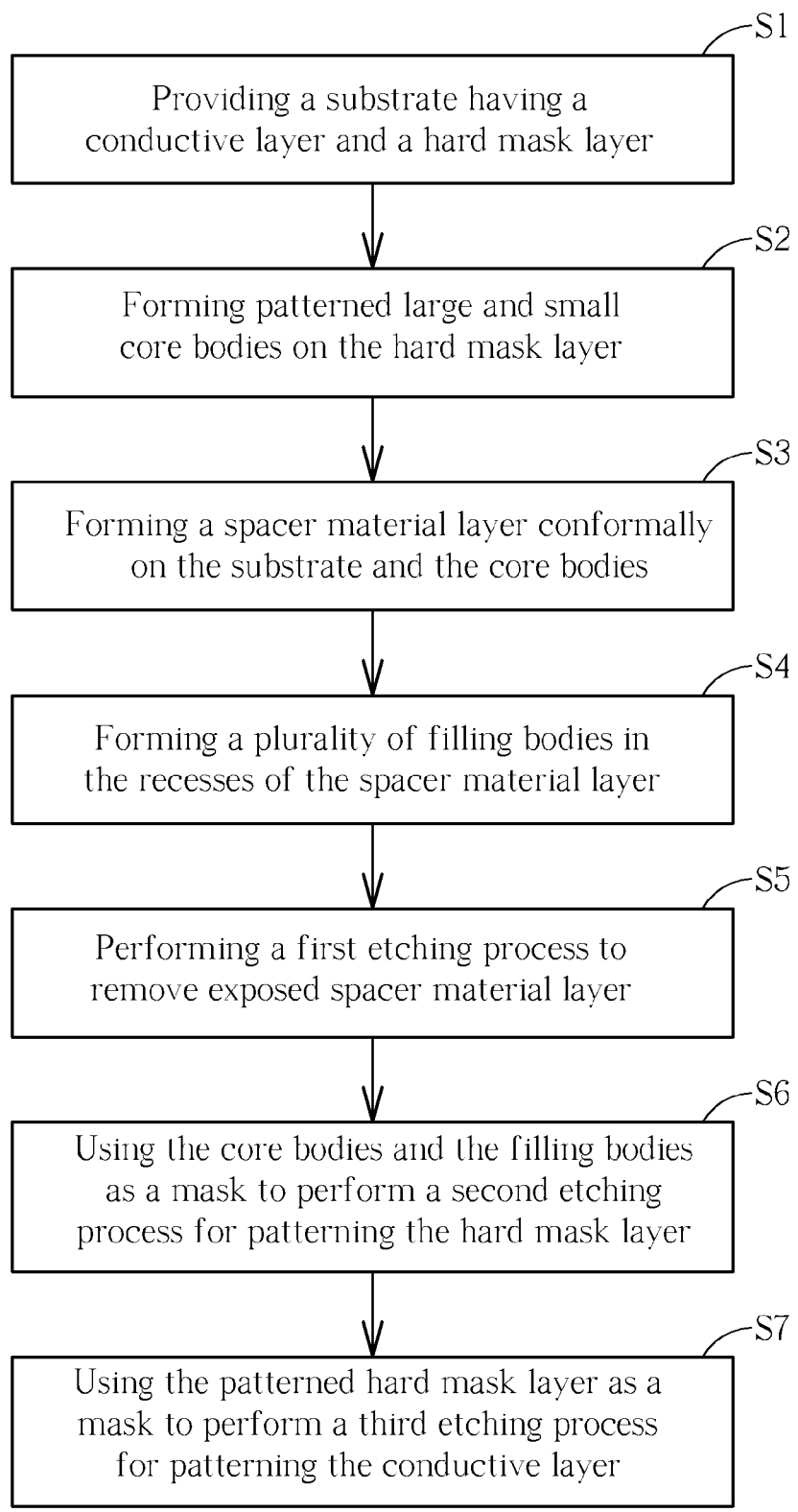
FIG. 11 is a main process flow of the semiconductor process in the present invention.

In conclusion, the process flow shown in FIG. 11 summarizes the semiconductor process of the present invention. The steps of the process flow may sequentially includes: providing a substrate having a conductive layer and a hard mask layer (S1), forming patterned large and small core bodies on the hard mask layer (S2), forming a spacer material layer conformally on the substrate and the core bodies (S3), forming a plurality of filling bodies in the recesses of the spacer material layer (S4), performing a first etching process to remove exposed spacer material layer (S5), using the core bodies and the filling bodies as a mask to perform a second etching process for patterning the hard mask layer (S6), and using the patterned hard mask layer as a mask to perform a third etching process for patterning the conductive layer (S7).

The essential feature of the aforementioned process claimed in the present invention is that: by the design of a larger interval between one side of the group of the small core bodies and the adjacent large core body and a smaller interval between the other side of the group of the small core bodies and the adjacent large core body, the outermost one of the odd number spaced-apart small circuit feature naturally produced by N-SADP process may be transformed to a larger circuit feature. In this manner, by further merging the transformed larger circuit feature with the adjacent large circuit feature, the desired pattern structure of an even number of equally-spaced small circuit patterns, which may serve as word lines, and large circuit patterns, which may serve as select gates, at the opposite sides may be obtained. This method solves the problem of the conventional negative self-aligned double patterning (N-SADP) process that can only produce an odd number of equally-spaced small circuit patterns (ex. word lines).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process for forming special pattern features, comprising:
providing a substrate having a target layer and a hard mask layer on said target layer;
forming a patterned material layer on said hard mask layer, wherein said patterned material layer is provided with a plurality of feature units, each said plurality of feature units comprises a plurality of small core bodies spaced-apart from each other by a first interval and a plurality of large core bodies at two opposite sides of said plurality of small core bodies and are spaced-apart from each other by a second interval, wherein a one of said plurality of large core bodies at a first one of said two opposite sides is spaced-apart from an adjacent one of said plurality of small core bodies by said first interval, and another one of said plurality of large core bodies at a second one of said two opposite sides is spaced-apart from another adjacent one of said plurality of small core bodies by said second interval, wherein said first interval is smaller than said second interval;
forming a spacer material layer conformally on said hard mask layer, on said plurality of small core bodies and on said plurality of large core bodies, wherein said spacer material layer is provided with a plurality of recesses, each of said plurality of recesses is located within each respective first interval and within each respective second interval;
filling up said plurality of recesses with a filling material so as to form a plurality of filling bodies;
using said plurality of filling bodies as a first mask to perform a first etching process for removing exposed said spacer material layer so as to form a plurality of small filling bodies and a plurality of large filling bodies, wherein each respective said first interval is filled with said plurality of small filling bodies and wherein each respective said second interval is filled with said plurality of large filling bodies;
using said plurality of small core bodies and said plurality of small filling bodies as a second mask to perform a second etching process for patterning said hard mask layer into a plurality of small hard mask bodies spaced-apart from each other, and simultaneously using said plurality of large core bodies and said plurality of large filling bodies as a third mask for patterning said hard mask layer into a plurality of large hard mask bodies, wherein said plurality of large hard mask bodies are at two opposite sides of said plurality of small hard mask bodies;
forming a photoresist layer on said plurality of large hard mask bodies at said two opposite sides of said plurality of small hard mask bodies; and
using said plurality of small hard mask bodies, said plurality of large hard mask bodies and said photoresist layer as a fourth mask to perform a third etching process for patterning said target layer into said special pattern features.

2. The semiconductor process for forming special pattern features according to claim 1, further comprising a step of performing a photolithographic process and an etching process to remove at least one said plurality of large hard mask body after patterning said hard mask layer.

3. The semiconductor process for forming special pattern features according to claim 1, wherein said semiconductor process is a negative self-aligned double patterning process.

4. The semiconductor process for forming special pattern features according to claim 1, wherein the number of said plurality of small hard mask bodies is twice the number of said plurality of small core bodies.

5. The semiconductor process for forming special pattern features according to claim 4, wherein the number of said plurality of small hard mask bodies is 2n, wherein n is a positive integer.

6. The semiconductor process for forming special pattern features according to claim 1, wherein said special pattern features comprises a plurality of word lines and a plurality of select gates.

7. The semiconductor process for forming special pattern features according to claim 6, wherein said plurality of small hard mask bodies is a pattern of an even number of spaced-apart word lines.

8. The semiconductor process for forming special pattern features according to claim 6, wherein said plurality of large hard mask bodies and said photoresist layer constitute a select gate pattern.

9. The semiconductor process for forming special pattern features according to claim 1, wherein said first interval is 84 nm and said second interval is 140 nm.

10. The semiconductor process for forming special pattern features according to claim 9, wherein said plurality of small hard mask bodies are spaced 28 nm apart from each other.

* * * * *